United States Patent [19]
Ohta et al.

[11] Patent Number: 5,767,569
[45] Date of Patent: Jun. 16, 1998

[54] TAB TAPE AND SEMICONDUCTOR CHIP MOUNTED ON TAB TAPE

[75] Inventors: Yukio Ohta; Kei Goto; Yoshihiro Notani; Yasuharu Nakajima; Akira Inoue; Hiroto Matubayashi, all of Tokyo, Japan

[73] Assignee: Mitsubishi Denki Kabushiki Kaisha, Tokyo, Japan

[21] Appl. No.: 584,293

[22] Filed: Jan. 11, 1996

[30] Foreign Application Priority Data

Aug. 7, 1995 [JP] Japan ..................... 7-201177

[51] Int. Cl.⁶ .................. H01L 23/495; H01L 23/48; H01L 23/52; H01L 23/34
[52] U.S. Cl. .................. 257/668; 257/692; 257/690; 257/664; 257/728
[58] Field of Search .................. 257/664, 668, 257/690, 692, 728

[56] References Cited

U.S. PATENT DOCUMENTS

| | | | |
|---|---|---|---|
| 5,206,712 | 4/1993 | Kornrumpf et al. | 257/684 |
| 5,338,975 | 8/1994 | Cole, Jr. et al. | 257/700 |
| 5,399,902 | 3/1995 | Bickford et al. | 257/691 |
| 5,428,247 | 6/1995 | Sohn et al. | 257/676 |
| 5,488,257 | 1/1996 | Bhattacharyya et al. | 257/774 |

FOREIGN PATENT DOCUMENTS

| | | |
|---|---|---|
| 57-44573 | 8/1980 | Japan. |
| 61-16534 | 1/1986 | Japan. |
| 63-15448 | 1/1988 | Japan. |
| 4-320390 | 11/1992 | Japan. |
| 6-232189 | 8/1994 | Japan. |

*Primary Examiner*—Teresa M. Arroyo
*Attorney, Agent, or Firm*—Leydig, Voit & Mayer, Ltd.

[57] ABSTRACT

The method for mounting a semiconductor chip comprises disposing conductive thermoplastic polyimide as a bonding material between an inner lead of the TAB tape and an external connecting electrode of the semiconductor chip, applying pressure to the conductive thermoplastic polyimide by a wedge with heating by a hot stage via the semiconductor chip. The semiconductor chip comprises the external connecting electrode adhered the conductive thermoplastic polyimide. The method for fabricating the semiconductor chip comprises forming a signal line and a protective film, forming an electrode pad on the signal line not provided the protective film, forming a conductive thermoplastic polyimide layer on the semiconductor wafer by spin coating, forming a resist on the conductive thermoplastic polyimide layer and performing an etching with using the resist as a mask. The inner lead of the TAB tape is made of conductive thermoplastic polyimide, not gilded. The flip-chip mounting substrate comprises a semiconductor chip connecting electrode comprising a signal line made of conductive thermoplastic polyimide, a protective film protecting the signal line, and adhering conductive thermoplastic polyimide on the signal line not providing the protective film. The microwave device comprises mounting the semiconductor chip in the inner lead of the TAB tape by adhering the external connecting electrode of the semiconductor chip to the inner lead of the TAB tape. Therefore, it is not required using high cost material for mounting the semiconductor chip, so that reducing in cost is accomplished.

4 Claims, 9 Drawing Sheets

TAB TAPE AND SEMICONDUCTOR CHIP MOUNTED ON TAB TAPE

FIELD OF THE INVENTION

The present invention relates to a mounting method of a semiconductor chip, a semiconductor chip, a fabricating method of a semiconductor chip, and a TAB tape, more particularly, to reduction in cost due to employment of conductive thermoplastic polyimide as a bonding material.

BACKGROUND OF THE INVENTION

Conventionally, as a method for mounting a semiconductor chip, there are a method using a TAB tape, and a flip-chip mounting method, which will be described below, respectively.

Figure 11:
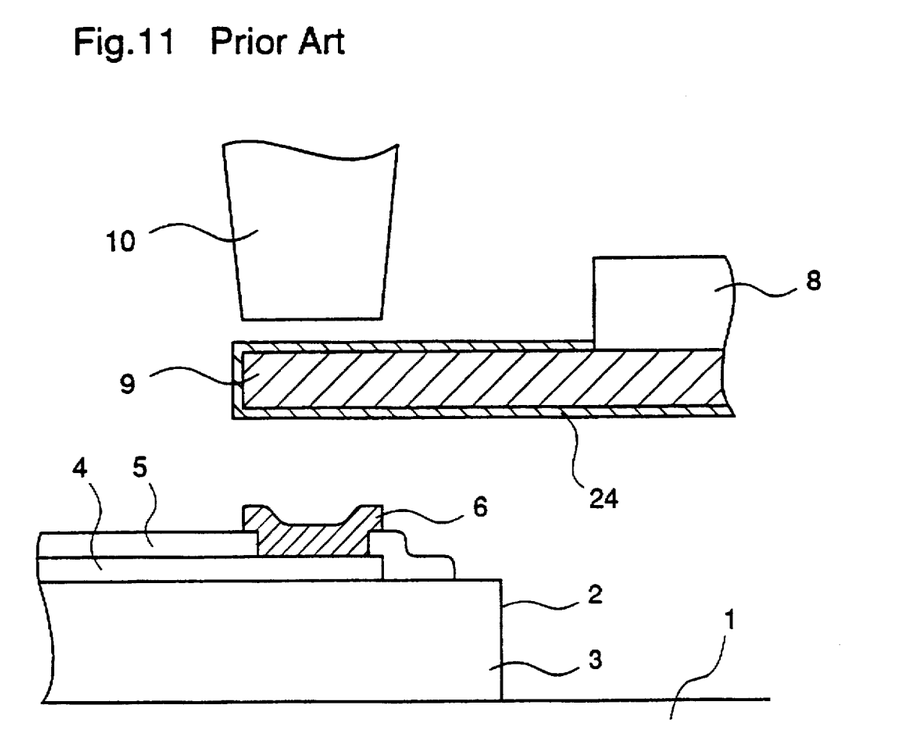
FIG. 11 is a cross-sectional view illustrating a mounting method of a semiconductor chip on a TAB tape according to a prior art.

FIG. 11 is a cross-sectional view illustrating main elements in the vicinity of the semiconductor chip for explaining the conventional mounting method of a semiconductor chip using a TAB (tape automated bonding). A semiconductor chip 2 comprising a signal line 4 for transmitting signals, the protective film 5 for protecting the signal line 4, the electrode pad 6 comprising gold or aluminum disposed on the signal line 4 where the protective film 5 is not provided, is disposed on a hot stage 1. In addition, the TAB tape 8 is provided a copper inner lead 9 gilding 24. Reference numeral 10 designates a wedge which presses the inner lead 9 from above.

Next, the prior art method for mounting the semiconductor chip to the TAB tape will be described.

On the electrode pad 6 of the semiconductor chip 2, the copper inner lead 9 gilding 24 is disposed, and the copper inner plate 9 and the electrode pad 6 of the semiconductor chip 2 is heated by the hot stage 1 via the semiconductor chip 2, and further it is applied pressure by the wedge 10, whereby the semiconductor chip 2 is connected to the inner lead of the TAB tape 8.

Figure 12:
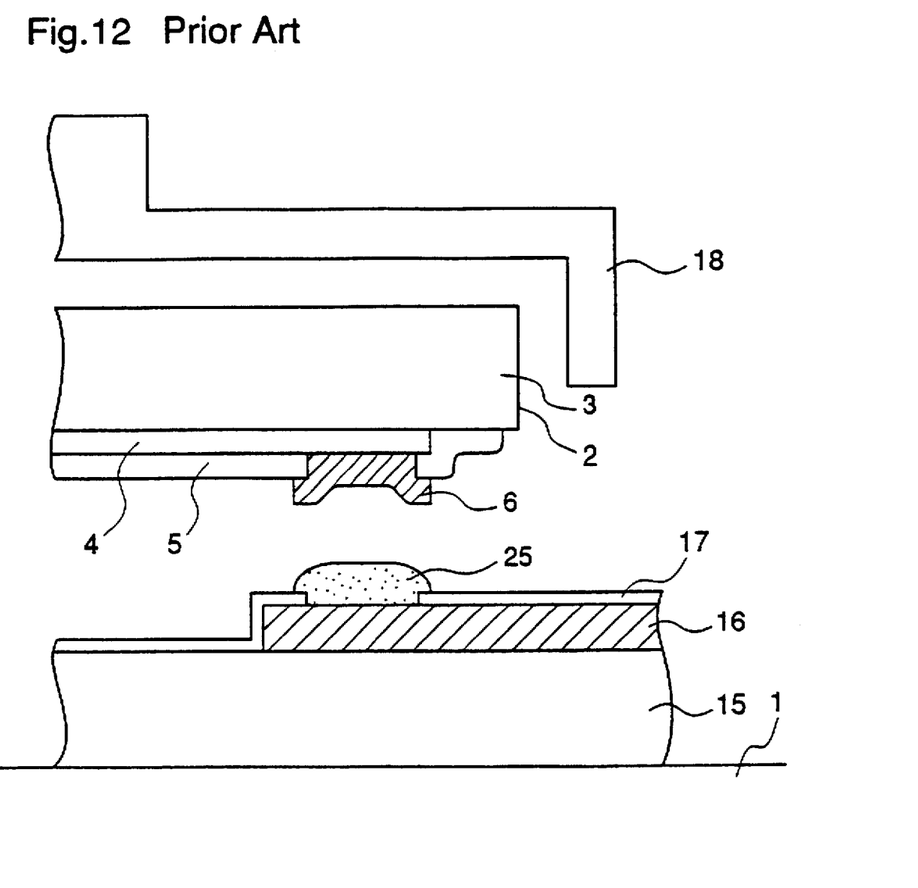
FIG. 12 is a cross-sectional view illustrating a mounting method of a semiconductor chip on a flip-chip substrate according to a prior art.

A description is given of the prior art flip-chip mounting. FIG. 12 is a cross-sectional view illustrating main elements in the vicinity of the semiconductor chip for explaining the conventional flip-chip mounting. In FIG. 12, the same reference numerals as in FIG. 11 designate the same or corresponding elements. The flip-chip mounting substrate 15 is provided with a signal transmission line 16, the protective film 17 protecting the signal line 16, and the solder material 25 comprising an alloy of Au and Sn, disposed on the signal line 16 where the protective film 17 is not provided, and it is disposed on the hot stage 1. In addition, reference numeral 18 designates a collete which pushes the semiconductor chip 2 from above.

A description is given of the prior art mounting method of a semiconductor chip on a flip-chip mounting substrate.

After disposing an electronic part such as the semiconductor chip 2 on the determined position of the flip-chip mounting substrate 15, the solder material 28 is heated by the hot stage 1 via the flip-chip mounting substrate 15 to its melting temperature, and the semiconductor chip 2 and the flip-chip mounting substrate 15 are pressed by the collete 18, whereby the semiconductor chip 2 is mounted on the signal line 16 of the flip-chip mounting substrate 15.

The prior art mounting method of the semiconductor chip on the TAB tape is performed as described above, and since the inner lead of the TAB tape is made of copper, it cannot be directly mounted on the electrode pad of the semiconductor chip comprising gold, aluminum or the like and, therefore, it is required to gild the surface of the inner lead of the copper TAB tape, whereby the reduction in cost of the semiconductor chip and the TAB tape is difficult.

In addition, in the prior art mounting method of the semiconductor chip on the flip-chip mounting substrate, it is required to form solder material comprising an alloy of gold and tin on a signal line after forming a signal line on the flip-chip mounting substrate, and it is difficult to reduce the cost of the semiconductor chip and the flip-chip mounting substrate.

SUMMARY OF THE INVENTION

It is an object of the present invention to provide a method for realizing a low cost mounting a semiconductor chip on a TAB tape.

It is another object of the present invention to provide a semiconductor chip and a TAB tape that enable a low cost mounting of a semiconductor chip on a TAB tape.

It is a still another object of the present invention to provide a method for realizing a low cost mounting a semiconductor chip on a flip-chip mounting substrate.

It is a yet another object of the present invention to provide a flip-chip mounting substrate that enables a low cost mounting a semiconductor chip on a flip-chip mounting substrate.

It is a further object of the present invention to provide a low cost microwave device and a fabricating method therefore due to employment of the above-described semiconductor chip and TAB tape.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method for mounting a semiconductor chip on a TAB tape by adhering an external connecting electrode of the semiconductor chip to an inner lead of the TAB tape, comprises disposing conductive thermoplastic polyimide as a bonding material between the inner lead of the TAB tape and the external connection electrode of the semiconductor chip, with giving plasticity to the conductive thermoplastic polyimide by heating with a hot stage on which the semiconductor chip is disposed, via the semiconductor chip, applying pressure to the conductive thermoplastic polyimide from above of the semiconductor chip by a wedge which presses the inner lead from above. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, whereby it is not required to gild the inner lead of the TAB tape, thereby the reduction in cost of the mounting can be accomplished.

According to a second aspect of the present invention, a method for mounting a semiconductor chip on a TAB tape by adhering an external connecting electrode of the semiconductor chip to an inner lead of the TAB tape, comprises disposing conductive thermoplastic polyimide as a bonding material between the inner lead of the TAB tape and the external connection electrode of the semiconductor chip, with giving plasticity to the conductive thermoplastic polyimide by heating with a wedge which presses the inner lead from above, applying pressure to the conductive thermoplastic polyimide from above of the semiconductor chip by the wedge. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, whereby it is not required to gild the inner lead of the TAB tape, thereby the reduction in cost of the mounting can be accomplished.

According to a third aspect of the present invention, a method for mounting a semiconductor chip on an inner lead of the TAB tape by adhering an external connecting electrode of the semiconductor chip to an inner lead of the TAB tape, comprises the semiconductor chip comprising the conductive thermoplastic polyimide adhered on the external connection electrode. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, whereby it is not required to gild the inner lead of the TAB tape, thereby the reduction in cost of the mounting can be accomplished.

According to a fourth aspect of the present invention, a semiconductor chip mounted on an inner lead of the TAB tape by adhering an external connecting electrode of the semiconductor chip to an inner lead of the TAB tape, comprises the semiconductor chip comprising the conductive thermoplastic polyimide adhered on the external connection electrode. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, and it is not required to gild the inner lead of the TAB tape, whereby the reduction in cost of mounting can be accomplished.

According to a fifth aspect of the present invention, in the above-described semiconductor chip, the external connecting electrode comprises a signal transmission line, a protective film protecting the signal transmission line, and an electrode pad disposed on the signal line not provided with the protective film, and adhering the conductive thermoplastic polyimide on the electrode pad. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, and it is not required to gild the inner lead of the TAB tape, whereby the reduction in cost of mounting can be accomplished.

According to a sixth aspect of the present invention, in the above-described semiconductor chip, the external connecting electrode comprises a signal transmission line, and a protective film protecting the signal transmission line, and the conductive thermoplastic polyimide is adhered on the signal line where the protective film is not provided. Therefore, since the conductive thermoplastic polyimide has good adhesiveness to copper, it is possible to connect the inner lead of the copper TAB tape and the copper signal line via the conductive thermoplastic polyimide, whereby there is no necessity to gild the inner lead of the TAB tape as well as to provide an electrode pad comprising gold or aluminum, resulting in reduction in cost of mounting.

According to a seventh aspect of the present invention, a method for fabricating a semiconductor chip comprises forming a signal transmission line and a protective film protecting the signal transmission line on a semiconductor wafer, and forming an electrode pad on the signal transmission line not provided the protective film, forming a conductive thermoplastic polyimide layer on the semiconductor wafer by spin coating, forming a resist on the conductive thermoplastic polyimide layer, and performing an etching with using the resist as a mask, thereby forming conductive thermoplastic polyimide on the electrode pad. Therefore, since the conductive thermoplastic polyimide which has good adhesiveness to copper as well as gold and aluminum is disposed on the electrode pad, it is possible to connect the inner lead of the copper TAB tape and the electrode pad comprising gold and aluminum via the conductive thermoplastic polyimide, whereby it is not required to gild the inner lead of the TAB tape, resulting in the reduction in cost of mounting.

According to an eighth aspect of the present invention, a method for mounting a semiconductor chip on a TAB tape by adhering an external connecting electrode of the semiconductor chip to an inner lead of the TAB tape, comprises the semiconductor chip comprising adhering conductive thermoplastic polyimide on its external connecting electrode, and not gilding the surface of the inner lead of the TAB tape. Therefore, since the conductive thermoplastic polyimide has good adhesiveness to copper as well as gold and aluminum, it is possible to connect the copper inner lead and the electrode pat comprising gold and aluminum via the conductive thermoplastic polyimide, and it is not required to gild the inner lead of the TAB tape, whereby the reduction in cost of the mounting can be accomplished.

According to a ninth aspect of the present invention, a TAB tape having an inner lead adhered an external connecting electrode of a semiconductor chip for mounting the semiconductor chip comprises no gilding the surface of the inner lead of TAB tape. Therefore, the conductive thermoplastic polyimide has good adhesiveness to copper and also has good adhesiveness to gold and aluminum, the copper inner lead of the TAB tape and the electrode pad made of gold or aluminum of the semiconductor chip can be connected via the conductive thermoplastic polyimide, so that there is no necessity of gilding the surface of the inner lead of the TAB tape, whereby the reduction in cost of the mounting can be accomplished.

According to a tenth aspect of the present invention, a method for mounting a semiconductor chip on an inner lead of a TAB tape by adhering an external connecting electrode of the semiconductor chip to an inner lead of the TAB tape, comprises the inner lead of the TAB tape comprising conductive thermoplastic polyimide adhered to an adhering portion with the external connection electrode of the semiconductor chip. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, and it is not required to gild the inner lead of the TAB tape, whereby the reduction in cost of the mounting can be accomplished.

According to an eleventh aspect of the present invention, a TAB tape for mounting a semiconductor chip by adhering an external connecting electrode of a semiconductor chip to an inner lead of the TAB tape, comprises the inner lead of the TAB tape adhering conductive thermoplastic polyimide to an adhering portion with the external connecting electrode of the semiconductor chip. Therefore, the conductive thermoplastic polyimide has good adhesiveness to copper and also has good adhesiveness to gold and aluminum, the copper inner lead of the TAB tape and the electrode pad made of gold or aluminum of the semiconductor chip can be connected via the conductive thermoplastic polyimide, so that there is no necessity of gilding the surface of the inner lead of the TAB tape, whereby the reduction in cost of the mounting can be accomplished.

According to a twelfth aspect of the present invention, a method for mounting a semiconductor chip on an inner lead of a TAB tape by adhering an external connecting electrode of the semiconductor chip to an inner lead of the TAB tape, comprises the inner lead of the TAB tape made of conductive thermoplastic polyimide. Therefore, since the conductive thermoplastic polyimide has good adhesiveness to copper as well as gold and aluminum, it is possible to connect the copper inner lead and the electrode pad comprising gold and aluminum via the conductive thermoplastic polyimide, and it is not required to gild the inner lead of the TAB tape, whereby the reduction in cost of the mounting can be accomplished.

According to a thirteenth aspect of the present invention, a TAB tape mounting a semiconductor chip on an inner lead thereof by adhering an external connecting electrode of the semiconductor chip to an inner lead of the TAB tape, comprises the inner lead of the TAB tape made of conductive thermoplastic polyimide. Therefore, there is no necessity of providing the gold or aluminum electrode pad at the external connecting electrode part of the semiconductor chip and forming the inner lead of the TAB tape by copper, and the reduction in cost of the mounting can be achieved, and the inner lead made of the conductive thermoplastic polyimide is not adhered to the wedge, whereby the mounting can be proceeded smoothly.

According to a fourteenth aspect of the present invention, a method for mounting a semiconductor chip on a semiconductor chip connecting electrode of an flip-chip mounting substrate by adhering an external connecting electrode of a semiconductor chip to a semiconductor chip connecting electrode of a flip-chip mounting substrate, comprises disposing conductive thermoplastic polyimide as a bonding material between the semiconductor chip connecting electrode of the flip-chip mounting substrate and the external connection electrode of the semiconductor chip, with giving plasticity to the conductive thermoplastic polyimide by heating with a hot stage on which the flip-chip mounting substrate is disposed, via the flip-chip mounting substrate, applying pressure to the semiconductor chip from above of the semiconductor chip by a collete which presses the semiconductor chip from above. Therefore, since the conductive thermoplastic polyimide has good adhesiveness to copper and has good adhesiveness to gold and aluminum, the signal line of the semiconductor chip on the copper flip-chip mounting substrate and the gold or aluminum electrode pad can be connected via the conductive thermoplastic polyimide, so that there is no necessity to form solder material on the semiconductor chip connecting electrode of the flip-chip mounting substrate, whereby reduction in cost at the mounting can be achieved.

According to a fifteenth aspect of the present invention, a flip-chip mounting substrate for mounting a semiconductor chip by adhering an external connecting electrode of the semiconductor chip and a connecting electrode of a flip-chip mounting substrate, wherein the semiconductor chip connecting electrode of the flip-chip mounting substrate comprises a signal transmission line, and a protective film protecting the signal transmission line, and conductive thermoplastic polyimide is adhered on the signal electrode where the protective film is not provided. Therefore, since the conductive thermoplastic polyimide has good adhesiveness to copper and also to gold and aluminum, the signal lines of the semiconductor chip on the copper flip-chip mounting substrate and the gold and aluminum electrode pad can be connected via the conductive thermoplastic polyimide, so that there is no necessity of forming solder material on the semiconductor chip connecting electrode of the flip-chip mounting substrate and forming an electrode pad on the external connecting electrode of the semiconductor chip, whereby the reduction in cost of mounting can be achieved.

According to a sixteenth aspect of the present invention, a flip-chip mounting substrate for mounting a semiconductor chip by adhering an external connecting electrode of a semiconductor chip and a semiconductor chip connecting electrode of a flip-chip mounting substrate, wherein the signal transmission line transmitting a signal on the flip-chip mounting substrate comprises conductive thermoplastic polyimide. Therefore, the signal line made of conductive thermoplastic polyimide has good adhesiveness to copper and also to gold or aluminum, so that there is no necessity to form copper signal lines on the flip-chip mounting substrate and to form the electrode pad on the external connecting electrode of the semiconductor chip, whereby the reduction in cost of mounting can be achieved.

According to a seventeenth aspect of the present invention, a method for fabricating a microwave device comprising mounting a semiconductor chip on an inner lead of a TAB tape by adhering an external connecting electrode of a semiconductor chip to the inner lead of the TAB tape, comprises the semiconductor chip comprising adhering conductive thermoplastic polyimide on its external connecting electrode. Therefore, the conductive thermoplastic polyimide has good adhesiveness to copper and also to gold and aluminum, and the copper inner lead and the gold and aluminum electrode pad can be connected via the conductive thermoplastic polyimide, so that there is no necessity of gilding the inner lead of the TAB tape, whereby the reduction in cost can be achieved while fabricating a microwave apparatus.

According to an eighteenth aspect of the present invention, a microwave device comprising mounting a semiconductor chip on an inner lead of a TAB tape by adhering an external connecting electrode of a semiconductor chip to the inner lead of the TAB tape comprises the semiconductor chip comprising adhering conductive thermoplastic polyimide on its external connecting electrode. Therefore, the conductive thermoplastic polyimide has good adhesiveness to copper and also to gold and aluminum, and the copper inner lead and the gold and aluminum electrode pad can be connected via the conductive thermoplastic polyimide, so that there is no necessity of gilding the inner lead of the TAB tape, whereby the reduction in cost can be achieved while fabricating a microwave apparatus.

DETAILED DESCRIPTION OF THE PREFERRED EMBODIMENTS

Embodiment 1

Figure 1:
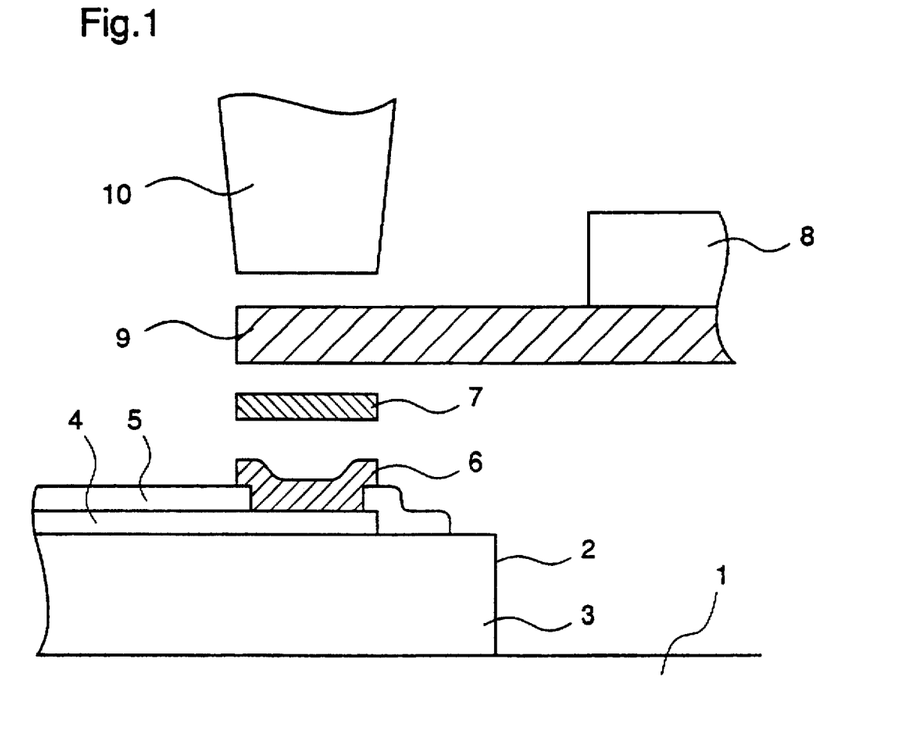
FIG. 1 is a cross-sectional view illustrating a mounting method of a semiconductor chip on a TAB tape according to a first embodiment of the present invention.

FIG. 1 is a cross-sectional view illustrating main elements in the vicinity of the semiconductor chip for explaining the mounting method of a semiconductor chip on an inner lead of a TAB tape according to a first embodiment of the present invention.

Construction 1

As shown in FIG. 1, the semiconductor chip 2 is provided with, on the semiconductor substrate 3, the signal line 4 transmitting signals, the protective film 5 protecting the signal line 4, the electrode pad 6 comprising gold or aluminum disposed on the signal line 4 where the protective film 5 is not provided, and it is disposed on the hot stage 1. In addition, the surface of the inner lead 9 of the TAB tape 8 is not gilded, and conductive thermoplastic polyimide 7 is disposed between the inner lead 9 of the TAB tape 8 and the electrode pad 6 of the external connecting electrode of the semiconductor chip 2. Numeral 10 designates a wedge which presses the inner lead 9 from above.

The mounting method of a semiconductor chip according to a first embodiment of the present invention comprises disposing conductive thermoplastic polyimide 7 as a bonding material between the inner lead 9 of the TAB tape 8 and the external connecting electrode of the semiconductor chip 2, thereafter applying pressure to the conductive thermoplastic polyimide 7 from above of the semiconductor chip 2 by the wedge 10 which presses the inner lead 9 from above with giving plasticity by heating with a hot stage 1 on which the semiconductor chip 2 is disposed, via the semiconductor chip 2, thereby mounting the semiconductor chip 2 to the inner lead 9 of the TAB tape 8.

As described above, according to the first embodiment, since the conductive thermoplastic polyimide 7 has good adhesiveness to copper as well as gold and aluminum, it is possible to connect the copper inner lead 9 and the electrode pad 6 comprising gold or aluminum via the conductive thermoplastic polyimide 7, therefore it is not required to gild the inner lead 9 of the TAB tape 8, whereby the reduction in cost of the mounting can be accomplished.

Construction 2

Further, the mounting method of a semiconductor chip according to a first embodiment of the present invention comprises, as shown in FIG. 1, disposing conductive thermoplastic polyimide 7 as a bonding material between the inner lead 9 of the TAB tape 8 and the external connecting electrode of the semiconductor chip 2, applying pressure to the conductive thermoplastic polyimide 7 from above of the semiconductor chip 2 by the wedge 10 which presses the inner lead 9 from above with giving plasticity by heating with a wedge which presses the inner lead 9 from above, thereby mounting the semiconductor chip 2 to the inner lead 9 of the TAB tape 8.

As described above, according to this first embodiment, since the conductive thermoplastic polyimide 7 has good adhesiveness to copper as well as gold and aluminum, it is possible to connect the copper inner lead 9 and the electrode pad 6 comprising gold or aluminum via the conductive thermoplastic polyimide 7, so that it is not required to gild the inner lead 9 of the TAB tape 8, whereby the reduction in cost of mounting can be accomplished. In addition, since the plasticity is given to the conductive thermoplastic polyimide by heating with the wedge 10, the heating portion is made to small relative to the mounting method of the semiconductor chip 2 to the inner lead 9 of the TAB tape 8 in the construction 1, which gives the plasticity to the conductive thermoplastic polyimide by heating with the hot stage 1 via the semiconductor chip 2, whereby the reliability of the semiconductor chip 2 is enhanced and the lifetime can be further lengthened.

Embodiment 2

Figure 2:
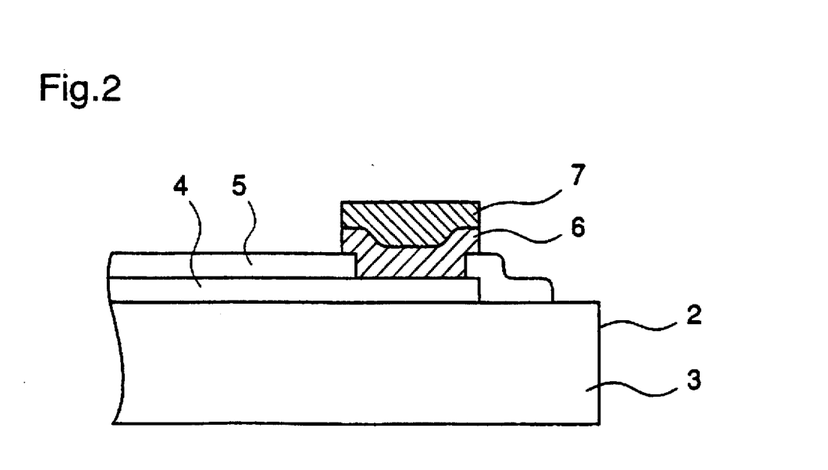
FIG. 2 is a cross-sectional view illustrating a semiconductor chip according to a second embodiment of the present invention.
Figure 3:
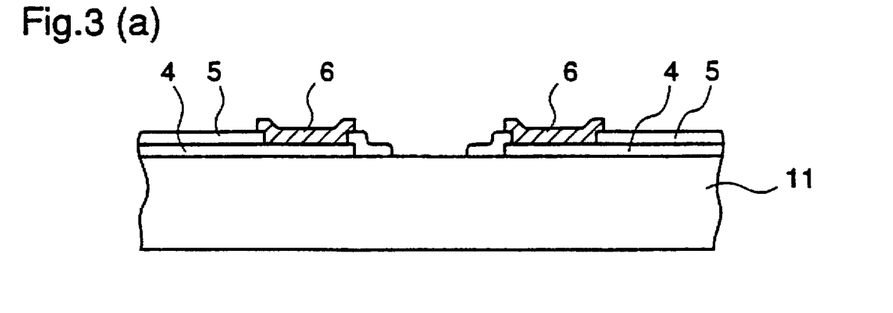
FIGS. 3(a)–3(d) are cross-sectional views illustrating a method for fabricating the semiconductor chip according to the second embodiment of the present invention.
Figure 4:
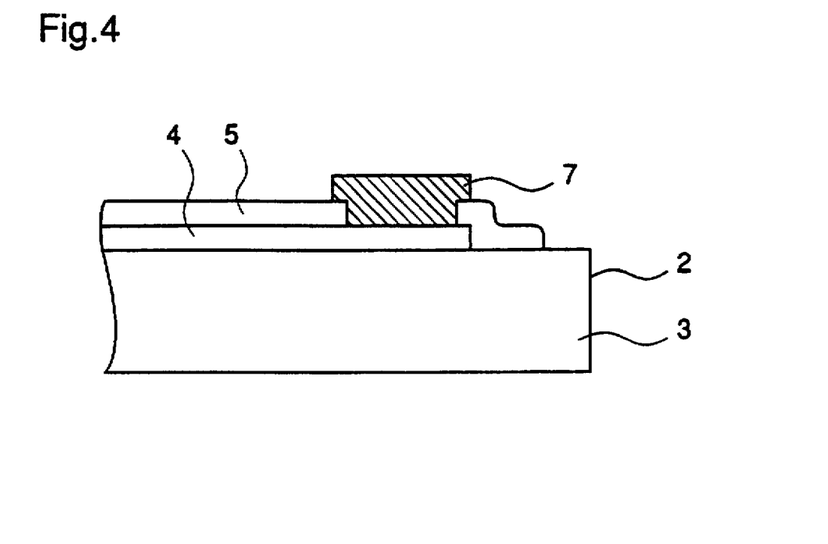
FIG. 4 is a cross-sectional view illustrating the semiconductor chip according to the second embodiment of the present invention.

FIGS. 2, 3, and 4 are cross-sectional views illustrating a semiconductor chip and a fabricating method thereof according to a second embodiment of the present invention.

Construction 1

In FIG. 2, the same reference numerals as in FIG. 1 designate the same or corresponding elements. As a construction of the semiconductor chip 2 shown in FIG. 2, the electrically conductive thermoplastic polyimide 7 is fixed on the external connecting electrode of the semiconductor chip 2.

As described above, according to a semiconductor chip in a second embodiment of the present invention, since the conductive thermoplastic polyimide 7 has good adhesiveness to copper as well as gold and aluminum, it is possible to connect the copper inner lead 9 and the electrode pad 6 comprising gold or aluminum via the conductive thermoplastic polyimide 7, therefore it is not required to gild the inner lead 9 of the TAB tape 8, whereby the reduction in cost of mounting can be accomplished.

Construction 2

A description is given of the semiconductor chip according to a second embodiment of the present invention.

In FIG. 2, the same reference numerals as in FIG. 1 designate the same or corresponding elements, the external connecting electrode of the semiconductor chip 2 comprises the signal transmission line 4, the protective film 5, and the electrode pad 6 disposed on the signal transmission line not providing the protective film, and adhering the electrically conductive thermoplastic polyimide 7 on the electrode pad 6.

As described above, according to a semiconductor chip in a second embodiment of the present invention, since the conductive thermoplastic polyimide 7 has good adhesiveness to copper as well as gold and aluminum, it is possible to connect the copper inner lead 9 and the electrode pad 6 comprising gold and aluminum via the conductive thermoplastic polyimide 7, so that it is not required to gild the inner lead 9 of the TAB tape 8, whereby the reduction in cost of mounting can be accomplished.

Construction 3

A description is given of the fabricating method of a semiconductor chip according to a second embodiment of the present invention.

In FIG. 3, the same reference numerals as in FIG. 1 designate the same or corresponding elements. Numeral 11 designates a semiconductor wafer, numeral 12 designates a resist. The fabricating method of a semiconductor chip shown in FIG. 3 comprises forming, on the semiconductor wafer 11 the signal line 4 transmitting signals, the protective film 5 for protecting the signal line 4, and the electrode pad 6 comprising gold or aluminum disposed on the signal line 4 where the protective film 5 is not provided. As shown in FIG. 3(b), an electrically conductive thermoplastic polyimide layer 7 on the semiconductor wafer 11 by spin coating, and forming a resist 12 on the conductive thermoplastic polyimide layer 7 and performing etching using it as a mask, thereby forming conductive thermoplastic polyimide 7 on the electrode pad 6.

As described above, according to the fabricating method of a semiconductor chip in a second embodiment of the present invention, since the conductive thermoplastic polyimide 7 which has good adhesiveness to copper as well as gold and aluminum is disposed on the electrode pad 6, it is possible to connect the inner lead 9 of the copper TAB tape 8 and the electrode pad 6 comprising gold or aluminum via the conductive thermoplastic polyimide 7, whereby there is no necessity to gild the inner lead 9 of the TAB tape 8, whereby the reduction in cost of mounting can be accomplished.

Construction 4.

A description is given of a semiconductor chip in this second embodiment.

In the FIG. 4, the same reference numerals as in FIG. 1 designate the same or corresponding elements. The semiconductor chip in FIG. 4 comprises the external connecting electrode of the semiconductor chip 2 comprising the signal line 4 transmitting the signals and the protective film 5 protecting the signal line 4, and adhering the electrically conductive thermoplastic polyimide 7 on the signal line 4 where the protective film 5 is not provided.

As described above, according to a semiconductor chip in the second embodiment, since the conductive thermoplastic polyimide 7 has good adhesiveness to copper, it is possible to connect the inner lead 9 of the copper TAB tape 8 and the copper signal line 4 via the conductive thermoplastic polyimide 7, whereby there is no necessity to gild the inner lead 9 of the TAB tape 8 as well as to provide an electrode pad comprising gold or aluminum, thereby resulting in reduction in cost for mounting.

Embodiment 3

Figure 5:
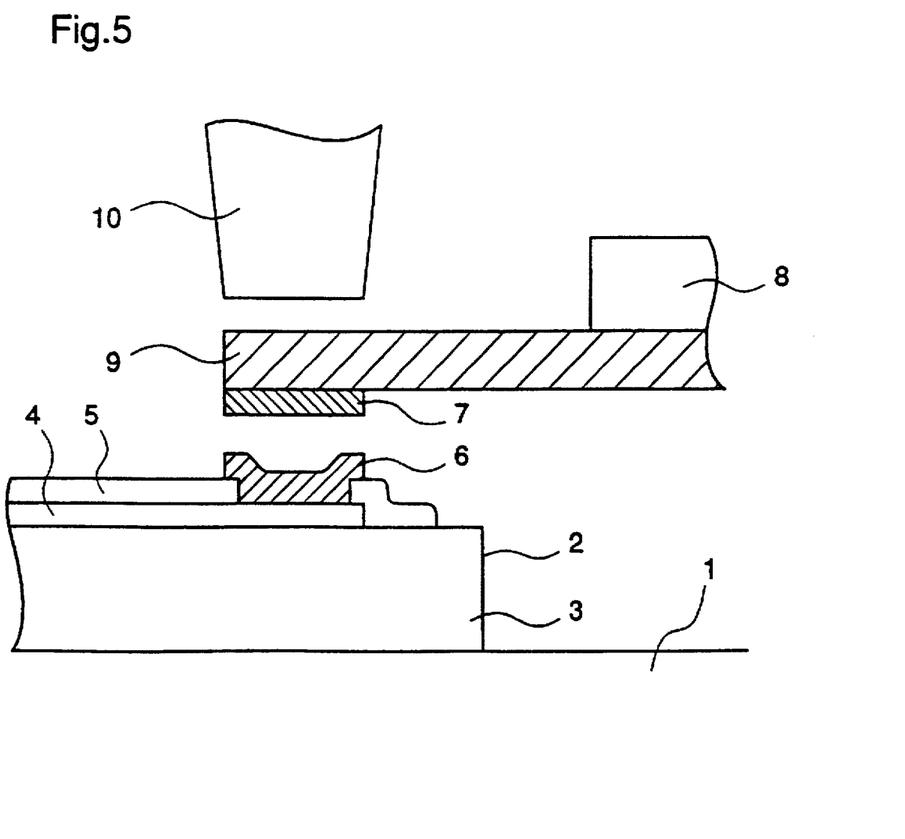
FIG. 5 is a cross-sectional view illustrating a TAB tape according to a third embodiment of the present invention.
Figure 6:
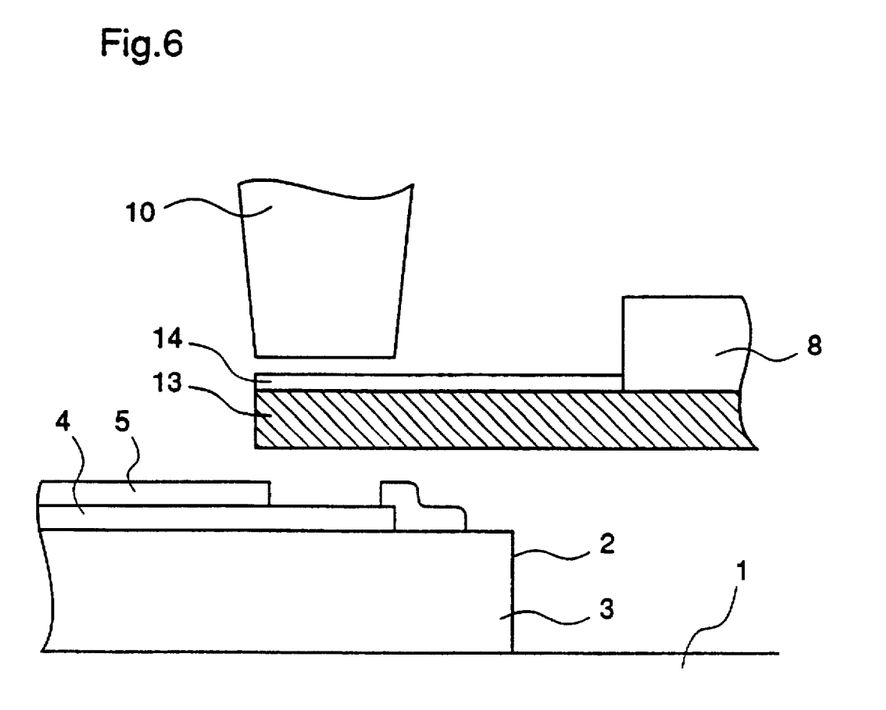
FIG. 6 is a cross-sectional view illustrating a TAB tape according to the third embodiment of the present invention.

FIGS. 5 and 6 are cross-sectional views illustrating a TAB tape according to a third embodiment of the present invention.

Construction 1

A description is given of a TAB tape according to a third embodiment of the present invention.

In FIG. 5, the same reference numerals as in FIG. 1 designates the same or corresponding elements. The TAB tape shown in FIG. 5 comprises the inner lead 9 of the TAB tape 8 comprising adhering the electrically conductive thermoplastic polyimide 7 at the adhering part of the semiconductor chip 2 with the external connecting electrode.

According to the third embodiment, since the conductive thermoplastic polyimide 7 has good adhesiveness to copper as well as gold and aluminum, the copper inner lead 9 of the TAB tape 8 and the gold or aluminum electrode pad 6 of the semiconductor chip 2 can be connected via the conductive thermoplastic polyimide 7, therefore there is no necessity of gilding the surface of the inner lead of the TAB tape 8, whereby the reduction in cost of the mounting can be accomplished.

Construction 2

A description is given of the TAB tape in the third embodiment of the present invention.

In FIG. 6, the same reference numerals as in FIG. 1 designate the same or corresponding elements. Numeral 13 designates an inner lead made of conductive thermoplastic polyimide, and numeral 14 designates a resin not thermoplastic type. The TAB tape 8 shown in FIG. 6 is provided with the inner lead 13 made of the electrically conductive thermoplastic polyimide, and resin 14 not thermoplastic type is disposed on the inner lead 13.

According to the third embodiment of the present invention, the inner lead 13 made of the conductive thermoplastic polyimide has good adhesiveness to copper as well as gold and aluminum, there is no necessity of providing the gold or aluminum electrode pad at the external connecting electrode part of the semiconductor chip 2. In addition, there is no necessity of making the inner lead of the TAB tape 8 of copper, thereby the reduction in cost of the mounting can be accomplished. Furthermore, since resin 14 not thermoplastic type is disposed on the inner lead 13 made of the conductive thermoplastic polyimide, even when the inner lead 13 is heated, given plasticity, and pressed by the wedge 10, the inner lead 13 does not adhere to the wedge 10, whereby the mounting can be proceeded smoothly.

Embodiment 4

Figure 7:
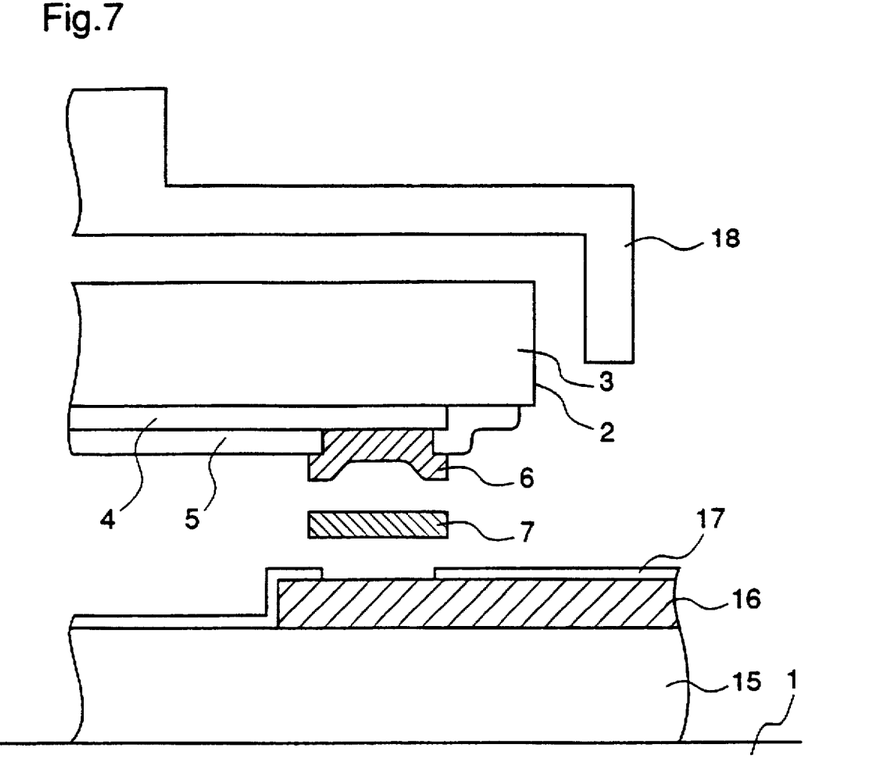
FIG. 7 is a cross-sectional view illustrating a mounting method of a semiconductor chip on a flip-chip mounting substrate according to a fourth embodiment of the present invention.

FIG. 7 is a cross-sectional view illustrating the main elements in the vicinity of the semiconductor chip illustrating the flip-chip mounting method according to a fourth embodiment of the present invention.

Construction 1

A description is given of the flip-chip mounting method of the fourth embodiment.

In FIG. 7, the same reference numerals as in FIG. 1 designate the same or corresponding elements. The flip-chip mounting substrate 15 is provided with the signal lines transmitting signals 16, and the protective film 17 protecting the signal lines 16, and disposed on the hot stage 1. In addition, numeral 18 designates a collete which presses the semiconductor chip 2 from above. In addition, no solder material is disposed on the semiconductor chip connecting electrode of the flip-chip mounting substrate 15 and the electrically conductive thermoplastic polyimide 7 is disposed between the semiconductor chip connecting electrode and the external connecting electrode of the semiconductor chip.

The flip-chip mounting method according to the fourth embodiment of the present invention comprises disposing the conductive thermoplastic polyimide 7 as a bonding material between the semiconductor chip connecting electrode of the flip-chip mounting substrate 15 and the external connecting electrode of the semiconductor chip 2, and applying pressure to the conductive thermoplastic polyimide 7 by the collete 18 which presses from above of the semiconductor chip 2 with giving the plasticity by heating with the hot stage 1 on which the flip-chip mounting substrate 15 is disposed via the flip-chip mounting substrate 15, thereby the semiconductor chip 2 is mounted on the semiconductor chip connecting electrode of the flip chip mounting substrate 15.

As described above, since the conductive thermoplastic polyimide 7 has good adhesiveness to copper as well as gold and aluminum, the signal line 16 of the semiconductor chip on the copper flip-chip mounting substrate 15 and the gold or aluminum electrode pad 16 can be connected via the conductive thermoplastic polyimide 7, therefore there is no necessity to form solder material on the semiconductor chip connecting electrode of the flip-chip mounting substrate 15, whereby reduction in cost at the mounting can be accomplished.

Embodiment 5

Figure 8:
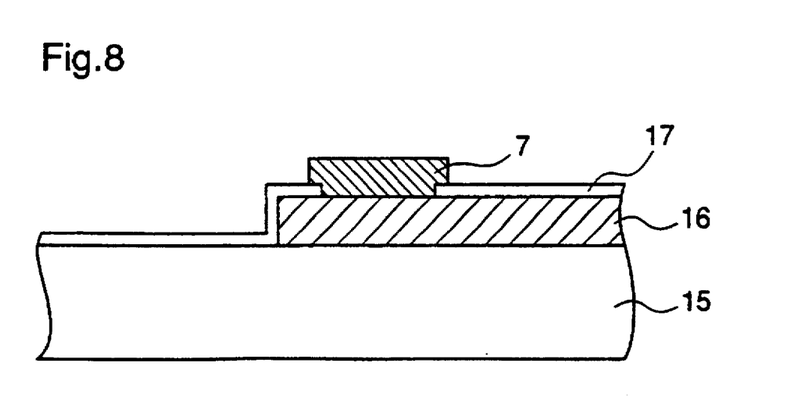
FIG. 8 is a cross-sectional view illustrating a flip-chip mounting substrate according to a fifth embodiment of the present invention.
Figure 9:
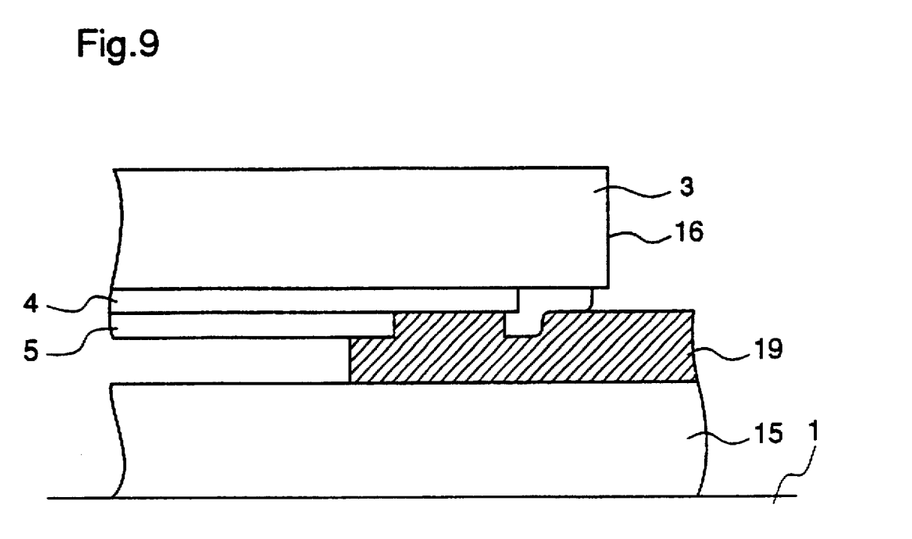
FIG. 9 is a cross-sectional view illustrating a flip-chip mounting substrate according to an alternative of the fifth embodiment of the present invention.

FIGS. 8 and 9 are cross-sectional views illustrating the flip-chip mounting substrate according to a fifth embodiment of the present invention.

Construction 1

A description is given of a flip-chip mounting substrate according to a fifth embodiment of the present invention. In FIG. 8, the same reference numerals as in FIG. 7 designate the same or corresponding elements. The flip-chip mounting substrate shown in FIG. 8 comprises the semiconductor chip connecting electrode of the flip-chip mounting substrate 15 comprising the signal lines 16 transmitting signals, the protective film 17 protecting the signal lines, and adhering the electrically conductive thermoplastic polyimide 7 on the signal line 16 not providing the protective film 17.

As described above, according to the fifth embodiment of the present invention, since the conductive thermoplastic polyimide 7 has good adhesiveness to copper as well as gold and aluminum, the signal lines 16 of the semiconductor chip on the copper flip-chip mounting substrate and the gold or aluminum electrode pad 8 can be connected via the conductive thermoplastic polyimide 7, therefore there is no necessity of forming solder material on the semiconductor chip connecting electrode of the flip-chip mounting substrate 15 as well as forming an electrode pad on the external connecting electrode of the semiconductor chip, whereby the reduction in cost of mounting can be accomplished.

Construction 2

A description is given of a flip-chip mounting substrate according to this fifth embodiment.

In FIG. 9, the same reference numerals as in FIG. 7 designate the same or corresponding elements. Numeral 19 designates a signal line made of the electrically conductive thermoplastic polyimide. The flip-chip mounting substrate shown in FIG. 9 comprises the signal line 19 transmitting signals on the flip-chip mounting substrate 15 made of the conductive thermoplastic polyimide.

As described above, according to this fifth embodiment, since the signal line 19 made of conductive thermoplastic polyimide has good adhesiveness to copper as well as gold or aluminum, there is no necessity to form copper signal lines on the flip-chip mounting substrate 15 as well as to form the electrode pad on the external connecting electrode of the semiconductor chip, whereby the reduction in cost of mounting can be accomplished.

Embodiment 6

Figure 10:
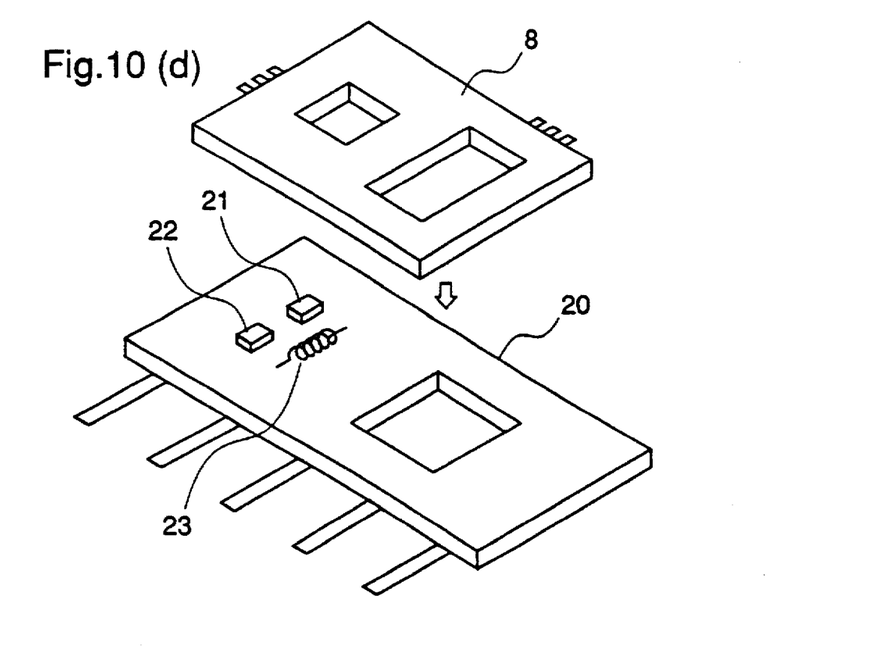
FIGS. 10(a)–10(d) are diagrams illustrating a method for fabricating microwave parts according to a sixth embodiment of the present invention.

FIG. 10 is a diagram showing a fabricating method of a microwave apparatus and a microwave apparatus according to a sixth embodiment of the present invention.

Construction 1

A description is given of a fabricating method of a microwave apparatus according to a sixth embodiment of the present invention.

In FIG. 10, the same reference numerals as in FIG. 1 designate the same or corresponding elements. Numeral 6a designates a signal electrode pad, numeral 6b designates a ground electrode pad, numeral 20 designates a module substrate, numeral 21 designates a chip resistor, numeral 22 designates a chip condenser, and numeral 23 designates an inductor. The microwave apparatus shown in FIG. 10 comprises the semiconductor chip comprising adhering the electrically conductive thermoplastic polyimide 7 on the external connecting electrode comprising such as the signal electrode pad 6a and the ground electrode pad 6b, and mounting the semiconductor chip on the TAB tape 8, and mounting this TAB tape 8 on the module substrate 20 provided with the chip resistor 21, the chip condenser 22, and the inductor 23.

As described above, in the flip-chip mounting substrate 15 according to this sixth embodiment, the conductive thermoplastic polyimide 7 has good adhesiveness to copper as well as gold and aluminum, therefore the copper inner lead 9 and the gold or aluminum electrode pad 6 can be connected via the conductive thermoplastic polyimide 7, so that there is no necessity of gilding the inner lead of the TAB tape, whereby the reduction in cost for fabricating a microwave apparatus can be accomplished.

Embodiment 7

FIGS. 10(a)–10(d) are diagrams showing a fabricating method of a microwave part according to a seventh embodiment of the present invention. FIG. 10(a) is a perspective view illustrating a semiconductor chip serving as a microwave part, FIG. 10(b) is a perspective view illustrating the semiconductor chip and a TAB tape mounting the semiconductor chip, FIG. 10(c) is a cross-sectional view illustrating the semiconductor chip and the TAB tape mounting the semiconductor chip shown in FIG. 10(b), and FIG. 10(d) is a perspective view illustrating electronics parts comprising the semiconductor chip and the TAB tape shown in FIG. 10(c) and a module substrate which mounts those. In these figures, the same reference numerals as in FIG. 1 designate the same or corresponding elements. Numeral 6a designates a signal electrode pad, numeral 6b designates a grounding electrode pad, numeral 20 designates a module substrate, numeral 21 designates a chip resistor, numeral 22 designates a chip condenser, and numeral 23 designates an inductor.

A description of the fabricating method of a microwave part of this seventh embodiment will be given with reference to FIGS. 10(a)–10(d).

The semiconductor chip 2 according to the first embodiment comprises one or more active elements, such as FET, or passive elements, i.e., a signal transmission line, MIM, an inductor, a filter, or the like, and a gold or aluminum electrode pad 6 for transmission of the RF signal, the millimeter wave, and the microwave signal DC. Particularly, as an electrode for RF-millimeter wave signal, a copalanar type electrode as sandwiching the signal electrode pad 6a by the ground electrode pad is formed and the electrically conductive thermoplastic polyimide 7 is adhered on respective electrode pad 6 for reduce of the transmission loss (FIG. 10a). Thereafter, the electrode pads 6 of respective semiconductor chips align and apply by heating to the inner lead 9 of TAB tape when the semiconductor chip 2 or parts of RF-millimeter wave, i.e., matching circuit or the like are disposed and mounted on the TAB tape 8 (FIG. 10(b), FIG. 10(c)). The semiconductor chip 2 and the parts of RF-millimeter wave or the like shown in FIG. 10(c) and the microwave part comprising the TAB tape are disposed, and predetermined RF module is constructed with other electric parts, for example the chip resist 21, the chip condenser 22, the inductor 23 or the like (FIG. 10(d)). Accordingly, since the conductive thermoplastic polyimide 7 is adhered on the electrode pad 6 of the semiconductor chip 2 when the microwave part is produced, it is not required gilding the inner lead 9 of the TAB tape 8, whereby it is possible to fabricate a microwave part in low cost.

Embodiment 8

While the electrode pad 6 is provided at the electrode portion of the semiconductor chip 2 and the conductive thermoplastic polyimide 7 is adhered on the electrode pad 6 in the seventh embodiment, electrode pads are not provided at the electrode portion of the electrically semiconductor chip and the conductive thermoplastic polyimide 7 is adhered on the signal transmission line 4 of the semiconductor chip 2 as shown in FIG. 4 in this eighth embodiment. Thus it is not required gilding the inner lead of the TAB tape, and providing the gold or aluminum electrode pad 6, whereby it is possible to fabricate a microwave part in low cost as the seventh embodiment.

Embodiment 9

While the electrode pad 6 is provided at the electrode portion of the semiconductor chip 2 and the electrically conductive thermoplastic polyimide 7 is adhered on the electrode pad 6 in the seventh embodiment, the conductive thermoplastic polyimide 7 is adhered on the inner lead 9 of the TAB tape as shown in FIG. 5 in this ninth embodiment. Thus it is not required gilding the inner lead of the TAB tape, and providing the gold or aluminum electrode pad 6, whereby it is possible to fabricate a microwave part in low cost as the seventh embodiment.

Embodiment 10

While the electrode pad 6 is provided at the electrode portion of the semiconductor chip 2 and the conductive thermoplastic polyimide 7 is adhered on the electrode pad 6 in the seventh embodiment, the inner lead of the TAB tape 8 is made of the electrically conductive thermoplastic polyimide 13 as shown in FIG. 6 in this tenth embodiment. Thus it is not required gilding the inner lead of the TAB tape, and providing the gold or aluminum electrode pad 6, whereby it is possible to fabricate a microwave part in low cost as the seventh embodiment.

What is claimed is:

1. A semiconductor chip mounted on and electrically connected to an inner lead of a TAB tape comprising:

a semiconductor chip having an external connecting electrode including a metal electrode pad;

a TAB tape including an electrically insulating tape and an inner lead extending beyond an edge of the tab tape; and an electrically conductive thermoplastic polyimide disposed between electrically connecting, and adhering the external connecting electrode and the inner lead.

2. The semiconductor chip of claim 1 wherein the external connecting electrode comprises a signal transmission line and a protective film protecting the signal transmission line, the electrode pad is disposed on the signal line, and the electrically conductive thermoplastic polyimide is adhered to the electrode pad.

3. The semiconductor chip of claim 1 wherein the external connecting electrode comprises a signal transmission line and a protective film protecting the signal transmission line, and the electrically conductive thermoplastic polyimide is adhered to the signal line where the protective film is missing.

4. The semiconductor chip mounted on a TAB tape according to claim 4 wherein the inner lead of the TAB tape is free of gilding.

* * * * *

UNITED STATES PATENT AND TRADEMARK OFFICE
CERTIFICATE OF CORRECTION

PATENT NO. : 5,767,569
DATED : June 16, 1998
INVENTOR(S) : Ohta et al.

It is certified that error appears in the above-identified patent and that said Letters Patent is hereby corrected as shown below:

Column 14, Line 36, change "4" to --1--.

Signed and Sealed this

Twenty-third Day of February, 1999

Attest:

Q. TODD DICKINSON

*Attesting Officer*  *Acting Commissioner of Patents and Trademarks*